(12) United States Patent
Yoshida et al.

(10) Patent No.: US 6,335,216 B1
(45) Date of Patent: Jan. 1, 2002

(54) METHOD FOR FABRICATING A SEMICONDUCTOR OPTICAL DEVICE HAVING A RIDGE STRIPE

(75) Inventors: Junji Yoshida; Keiichi Yabusaki; Naoki Tsukiji, all of Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/560,570

(22) Filed: Apr. 28, 2000

(30) Foreign Application Priority Data

Oct. 30, 1998 (JP) ............................................ 10-309807

(51) Int. Cl.[7] .............................................. H01L 21/00
(52) U.S. Cl. ............................ 438/40; 438/38; 438/725
(58) Field of Search ............................ 438/40, 38, 717, 438/725, 736, 948; 430/502, 503

(56) References Cited

U.S. PATENT DOCUMENTS 5,658,823 A * 8/1997 Yang ............................ 438/38
6,171,876 B1 * 1/2001 Yuang et al. .................. 438/22

FOREIGN PATENT DOCUMENTS

JP            6-1349           1/1994

* cited by examiner

*Primary Examiner*—Caridad Everhart
(74) *Attorney, Agent, or Firm*—Oblon, Spivak, McClelland, Maier & Neustadt, P.C.

(57) ABSTRACT

A method for fabricating a semiconductor laser device includes the steps of patterning a first photoresist film on a top of a ridge stripe of a laser structure by using a second photoresist film as a mask. The first photoresist film is used for selectively etching an insulator film on the ridge stripe selectively from other portion on the side surfaces of the ridge stripe. The first photoresist film is of a negative image type having a viscosity of 50 centipoises.

7 Claims, 5 Drawing Sheets

METHOD FOR FABRICATING A SEMICONDUCTOR OPTICAL DEVICE HAVING A RIDGE STRIPE

BACKGROUND OF THE INVENTION (a) Field of the Invention

The present invention relates to a method for fabricating a semiconductor optical device having a ridge stripe and, more particularly, to an improvement of its optical characteristics.

(b) Description of a Related Art

A semiconductor laser device having a ridge stripe for confinement of emitted laser light and injection current therein has excellent laser characteristics as well as the advantage of a simple structure, and thus is used as pump sources for fiber amplifiers in the optical communication system, or light source for optical recording system and optical measurement system.

For fabrication of the semiconductor laser device having the ridge stripe, a heterojunction structure of semiconductor layers is formed on a semiconductor substrate, followed by formation of the ridge stripe at the top portion of the semiconductor layers. Thereafter, an insulator film is formed on the entire surface of the semiconductor layer structure and selectively removed at the top of the ridge stripe. After forming electrodes at the top and bottom portion for current injection, a semiconductor laser device having the semiconductor layer structure is obtained.

FIGS. 1A to 1H show consecutive steps of a conventional process for fabricating a ridge stripe in a semiconductor laser device.

A heterojunction semiconductor layer structure 10 formed on a semiconductor substrate 11 has therein an active layer 12 including one or more of quantum well active layer, and has a ridge stripe with a double channel structure at the top portion. That is, the semiconductor layer structure includes ridge stripe 14 at the top thereof and a pair of channels 13 at both sides of the ridge stripe 13, as shown in FIG. 1A. A thin insulator film 15 is then formed on the entire surface, as shown in FIG. 1B.

A first resist film 16 is formed thereon by spin-coating to a specified thickness, which is thicker than the height of the ridge stripe 14 with respect to the channels 13, as shown in FIG. 1C, followed by a heat treatment to obtain an insoluble property thereof. A second resist film 17 is then formed by spin-coating on the first resist film 16, as shown in FIG. 1D.

Thereafter, the second resist film 17 is subjected to a patterning using a photolithographic and etching process including exposure and development steps. Thus, the second resist film 17 is etched selectively from the first resist film 16, to form a mask 17 having an opening 18 therein above the top of the ridge stripe 14, as shown in FIG. 1E. Subsequently, the first resist film 16 is subjected to an oxygen-plasma ashing process for selectively removing the first resist film 16 at the opening 18 by using the mask 17, as shown in FIG. 1F.

The insulator film 15 is then removed by using reactive io etching (RIE) at the bottom of the opening 18 to expose the top of the ridge stripe 14, as shown in FIG. 1G. The first and second resist films 16 and 17 are then entirely removed using a plasma ashing process to expose the remaining portion of the insulator film 15. The top surface of the ridge stripe 14 is generally implemented by a contact layer having a function for assuring electric contact with an electrode to be formed thereon.

In the conventional process as described above, two different resist films of a positive image type having different viscosity coefficients are used for the first and second resist films 16 and 17.

In the etching process for the insulator film 15, there is a problem in that the insulator film 15 is sometimes removed at both side surfaces of the ridge stripe 14 in spite of the fact that the insulator film 15 is desired to cover the side surfaces of the ridge stripe while exposing the top of the ridge stripe 14.

The reason of the problem is that the first resist film 16 is in fact etched to some extent at the top of the ridge stripe 14 due to the poor reproducibility or controllability in the conditions or amount of the exposure light in the photolithographic and etching process for the second resist film 17. This causes the portion of the first resist film 16 covering the ridge stripe 14 to have a thinner thickness or to have small openings at the sides of the ridge stripe 14. This in turn causes the oxygen-plasma ashing for removing the first resist film 16 to damage the insulator film 15 or etch the insulator film 15 at the side surfaces of the ridge stripe 14, as shown in FIG. 1G. The exposure of the side surfaces of the ridge stripe 14, especially exposure of the sides of the upper cladding layer in the ridge stripe 14, causes degradation of the laser characteristics. Particularly, the degradation due to the COD (catastrophic optical destruction) is a crucial problem for AlGaAs material system.

The exposure of the side surfaces of the ridge stripe 14 occurs especially in the case of a ridge stripe having a narrow width as small as 6 $\mu$m or less, due to the alignment error of the mask with respect to the ridge stripe. This may be alleviated to some extent by using a fine alignment of the mask, which, however, consumes a large time length and reduces the process efficiency.

Patent Publication JP-A-6-1349 describes a plurality of layered resist films having different solubility coefficients, which may assure a safe etching of the second resist film 17 selectively from the first resist film 16 in the above process. However, in our experiments, this technique was not effective in the above process due to the presence of the ridge stripe 14, which caused different thicknesses in the first resist film on the top of the ridge stripe 14 depending on the viscosity coefficient thereof after the spin-coating. The different thicknesses in turn caused a residual portion of the first resist film after the oxygen-plasma ashing for the first resist film, which reduced yield of the products.

As described above, the conventional process does not offer a satisfactory solution for the problem that the insulator film is etched at the side surfaces of the ridge stripe to expose the upper cladding layer, and thus a semiconductor optical device having a ridge stripe has poor characteristics. In addition, the selective etching of the second photoresist film is not conducted with a satisfactory productivity or process efficiency In the above description, the problem of a semiconductor laser device is exemplified. However, the above problem is common to other semiconductor optical devices having a ridge structure, such as a ridge waveguide photodetector or a semiconductor amplifier.

SUMMARY OF THE INVENTION

In view of the above, it is an object of the present invention to provide a method for fabricating a semiconductor optical device having a ridge stripe and excellent device characteristics at a relatively low cost or high process efficiency.

The present invention provides a method for fabricating a semiconductor optical device including the steps of: forming a layer structure including semiconductor active layer on a semiconductor substrate; forming a ridge stripe on the semiconductor layer structure; forming an insulator film on the semiconductor layer structure including the ridge stripe; forming on the insulator film a first photoresist film of a negative image type having a viscosity of 50 centipoises or less; forming a second photoresist film on the first resist film; patterning the first and the second photoresist films to have therein an opening for exposing a portion of the insulator film at a top of the ridge stripe; removing the portion of the insulator film exposed by the opening; and forming an optical device having the semiconductor active layer, the patterning step including development using a liquid developer to which the first and the second resist films have different solubility coefficients.

In accordance with the method of the present invention, the configurations including the different solubility coefficient of the first and second photoresist films with respect to the liquid developer, and the first photoresist film having a negative image type and a viscosity of 50 centipoises or less can afford excellent patterning of the second photoresist film without etching of the first photoresist film in the vicinity of the top surface of the ridge stripe during exposure and development steps for the second photoresist film.

The above and other objects, features and advantages of the present invention will be more apparent from the following description, referring to the accompanying drawings.

PREFERRED EMBODIMENTS OF THE INVENTION

The method of the present invention can be preferably applied to forming a semiconductor laser device having a ridge stripe and a semiconductor photodetector having a ridge waveguide. In the method of the present invention, it is preferable that the patterning step includes the steps of first patterning which selectively etches the second photoresist film to have a first opening, and second patterning which selectively etches the first photoresist film by using the first opening in the second photoresist film to form a second opening.

The photoresist materials for the first and the second photoresist films are not limited so long as both the photoresist materials for the first and the second photoresist films have different solubility coefficients to the liquid developer, and the photoresist material for the first photoresist film has a viscosity of 50 centipoises or less and is of a negative image type which is made insoluble to the liquid developer by exposure to irradiation such as ultraviolet ray. The photoresist material for the second photoresist film is preferably of a positive image type which is made soluble to the liquid developer by exposure to irradiation such as ultraviolet ray. A preferable thickness of the first photoresist film is below the thickness of the contact layer in the semiconductor laser structure.

Now, the present invention is more specifically described with reference to accompanying drawings.

Referring to FIGS. 2A to 2K, there are shown consecutive steps of a method according to an embodiment of the present invention and applied to a semiconductor laser device having a ridge stripe with a double channel structure.

Figure 1A:
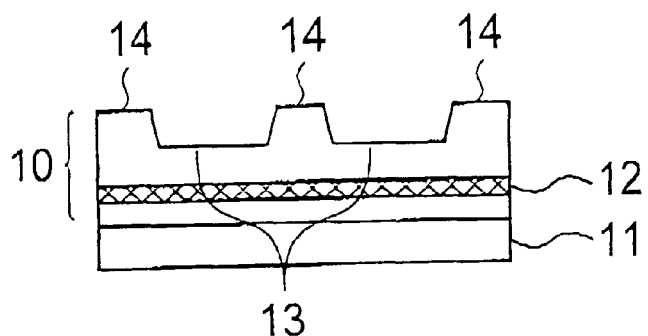
FIGS. 1A to 1H are sectional views of a semiconductor laser device in consecutive steps of a conventional method for fabrication thereof.
Figure 1B:
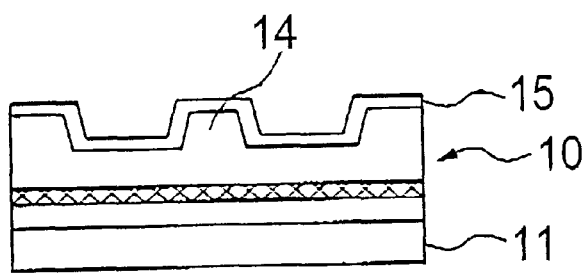
Figure 1C:
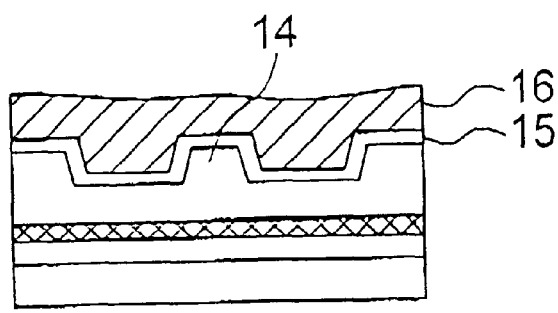
Figure 1D:
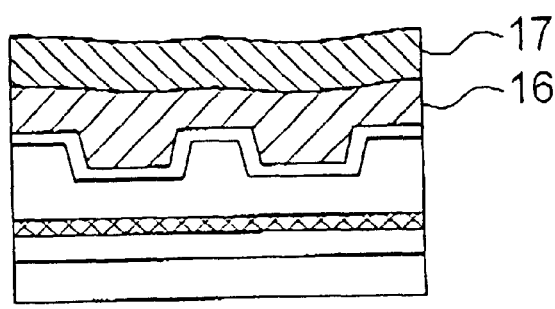
Figure 1E:
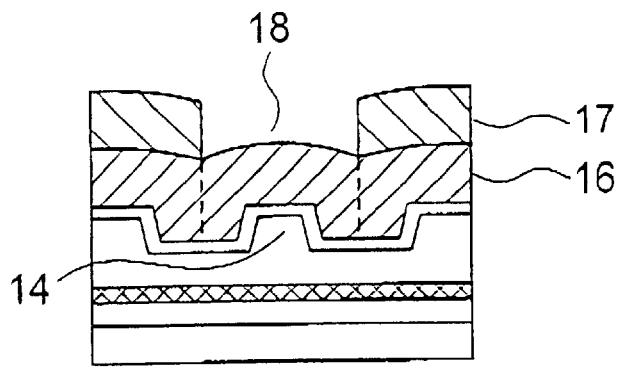
Figure 1F:
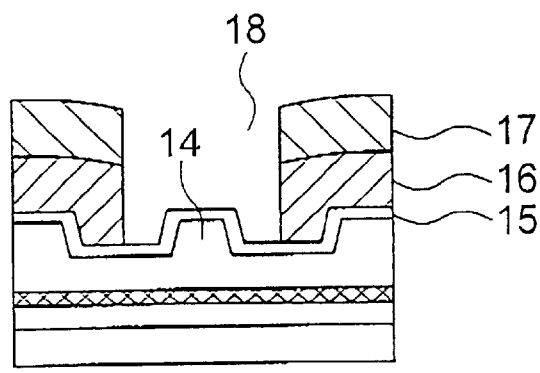
Figure 1G:
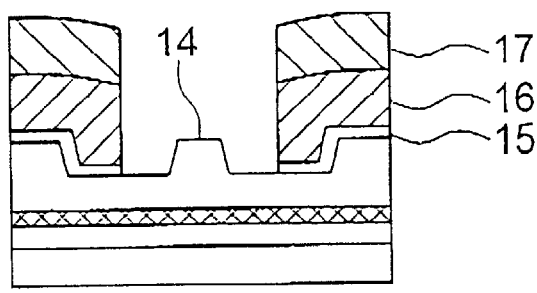
Figure 1H:
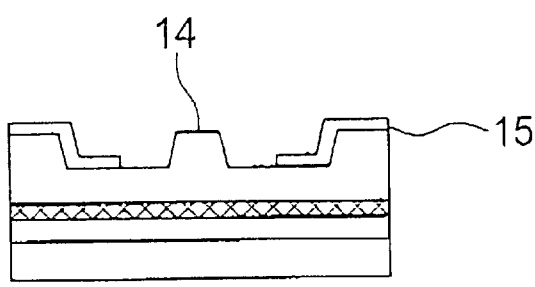
Figure 2A:
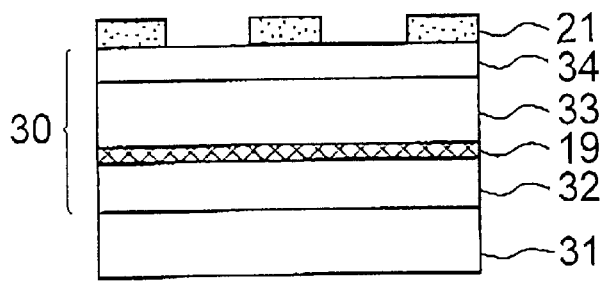
FIGS. 2A to 2K are sectional views of a semiconductor laser device in consecutive steps of a method according to an embodiment of the present invention.

First, a semiconductor laser structure 30 including a MQW active layer 19, for example, is formed on an n-type semiconductor substrate 31 to form a wafer 20, the semiconductor laser structure 30 typically including at least a lower cladding layer 32, the MQW active layer 19, an upper cladding layer 33 and a contact layer 34, which are epitaxially grown consecutively on the semiconductor substrate 31. A photoresist film 21 is then formed on the semiconductor laser structure 30 and subjected to patterning thereof by using an exposure and developing technique to form a photoresist mask 21, as shown in FIG. 2A.

Figure 2B:
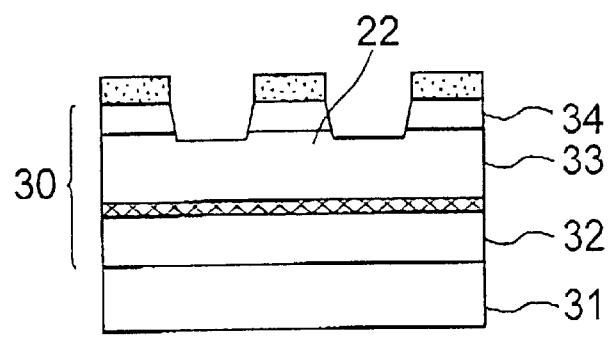

Subsequently, the semiconductor laser structure 30 is subjected to a wet etching process by using a citric acid based etchant and the photoresist mask 21 to form a ridge stripe 22 on the top portion of the semiconductor laser structure 30 and a pair of channels disposed adjacent to the ridge stripe 22, as shown in FIG. 2B.

Figure 2C:
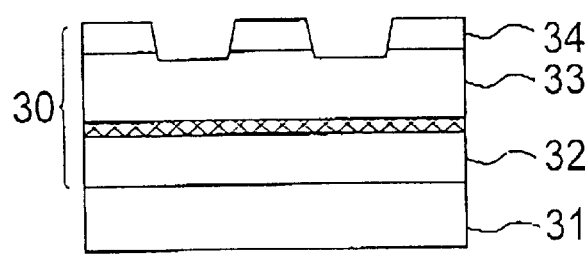
Figure 2D:
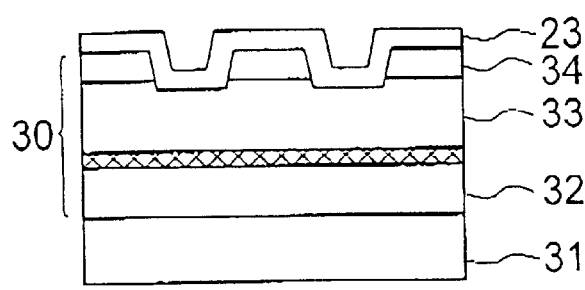

Thereafter, as shown in FIG. 2C, the photoresist mask 21 is removed by using a dissolving liquid and an additional oxygen-plasma ashing, the former most part of the photoresist mask 21 and the latter removing the residual film. An insulator film 23 is then deposited on the entire surface of the semiconductor laser structure 30 by using a plasma enhanced CVD technique, as shown in FIG. 2D. In an example of the present embodiment, a silicon nitride film with 0.13 $\mu$m thickness was formed as the insulator film 23.

A first photoresist film 24 is then formed on the insulator film 23 by spin-coating. A negative-image type photoresist material, "OMR-83" supplied from Tokyo Oka Inc., having a viscosity of 20 centipoises was used as the first photoresist film 24 in the example. In the example, the ridge stripe 22 had a height of 1.8 to 2.0 $\mu$m and the photoresist material was formed thereon by spin-coating, wherein the disk of the spin-coater was rotated at 3000 rpm.

Figure 2E:
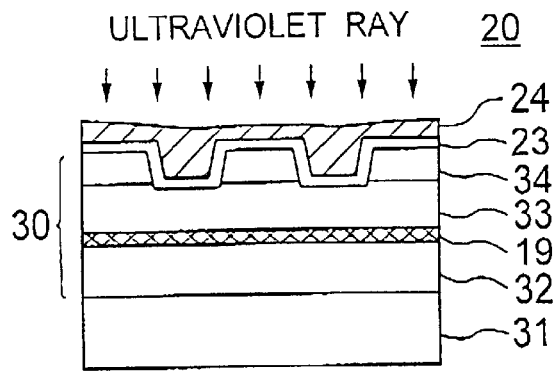

The first photoresist film is then subjected to a baking treatment at a substrate temperature of 110° C. for five minutes, followed by exposure to ultraviolet ray in the entire area, as shown in FIG. 2E. The exposure to ultraviolet ray makes the first photoresist film 24 insoluble to a liquid developer.

Figure 2F:
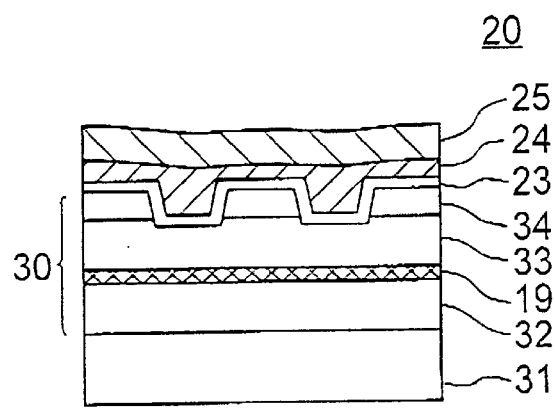
Figure 2G:
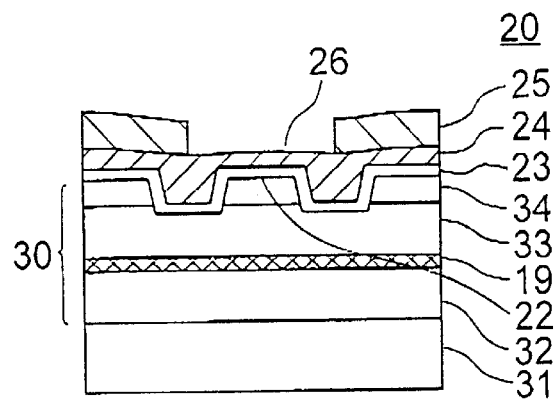

A second photoresist film 25 of a positive image type is then formed on the first photoresist film 24 by spin-coating, as shown in FIG. 2F, followed by patterning thereof using an exposure and development process to form a mask pattern 25 having an opening 26, as shown in FIG. 2G. In the example, a photoresist material of a positive image type, "AZ1500" supplied from Hoechst Inc., was used as the second photoresist film 25. The exposure was effected by a photo-mask aligner.

Figure 2H:
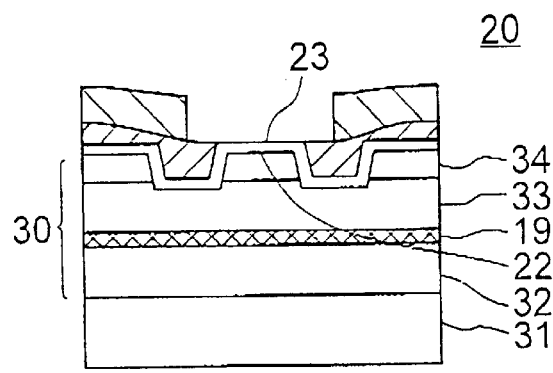
Figure 2I:
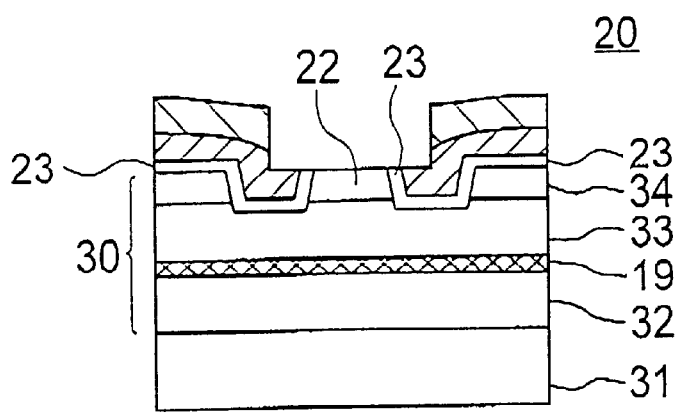

The first photoresist film 24 is then subjected to an oxygen-plasma ashing process for etching thereof to expose a portion of the insulator film 23 at the bottom of the opening 26, as shown in FIG. 2H. In the oxygen plasma ashing, the time length for etching the first photoresist film 24 is controlled so that a portion of the insulator film 23 appears above the top of the ridge stripe 22.

In the example, the material for the first photoresist film 24 having a low viscosity as low as 20 centipoises afforded excellent fluidity on the entire surface and a substantially constant thickness ranged between 0.14 $\mu$m and 0.26 $\mu$m at the top surfaces of the ridge stripes in the entire area of the substrate. The portion of the first photoresist film 24 remaining on the channels ranged between 1.6 μm and 1.8 μm. Then, after oxygen-plasma etching of the first photoresist film 24 and dry etching of the insulator film 23 on the top surface of the ridge stripe 22, etching was stopped at a contact layer, not exposing the upper cladding layer at the side surface of the ridge stripe.

That is, the first photoresist film 24 has a function for protecting the etching of the insulator film 23 at the side surfaces of the ridge stripe 22. In a comparative example wherein the material for the first photoresist film 24 had a viscosity of 60 centipoises, the thickness of the first photoresist film on the top surface of the ridge stripe ranged between 0.2 μm and 0.4 μm. The minimum thickness of 0.2 μm resulted in incomplete removal of the first photoresist film in the dry etching at the top surface of the ridge stripe 22 degrading the production yield. On the other hand, the maximum thickness of 0.4 μm resulted in deep etching of the first photoresist film and the insulator film at the side surfaces of the ridge stripe 22 exposed to the upper cladding layer, whereby laser characteristics degraded.

The configuration wherein the first and the second photoresist films 24 and 25 are of the negative image type and of the positive image type, respectively, can afford an effective etching of the second photoresist film selectively from the first photoresist film because the development of the second photoresist film stops at the top surface of the first photoresist film. Thus, the first photoresist film is left on the semiconductor laser structure while having substantially the original thickness.

Subsequently, the portion of the insulator film 23 on the top surface of the ridge stripe 22 is removed by plasma etching process using fluorocarbon based gas. Thus, the contact layer, for example, disposed as the top layer of the semiconductor laser structure is exposed on the top of the ridge stripe 22. In the example fabricated, 98% of the silicon nitride film was uniformly removed from the top surface of the ridge stripe 22.

Figure 2J:
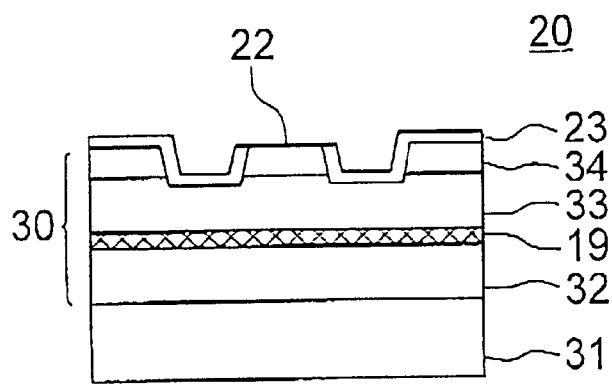

Then, the first and the second photoresist films 24 and 25 are removed by dissolving in an etchant including phenol and alkyl-benzene sulfonic acid at a ratio of 6:2, as shown in FIG. 2J, followed by oxygen-plasma ashing to remove residual photoresist films.

Figure 2K:
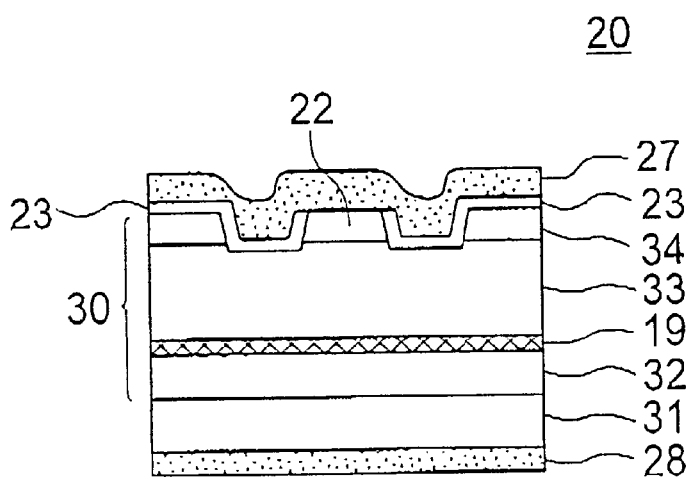

Thereafter, a p-side electrode 27 including Ti/Pt/Au/ films is formed on the insulator film 23 and the exposed top surface of the ridge stripe 22. The bottom surface of the semiconductor substrate 31 is then polished, followed by formation of an n-side electrode 28 including Au/Ge/Ni films on the polished bottom surface, as shown in FIG. 2K. The wafer 20 is then separated by cutting into a plurality of laser, chips, each of which is fabricated as a semiconductor laser module after packaging and mounting processes.

The materials for the photoresist films are not limited to the above embodiment, and any materials may be selected so long as the material for the first photoresist film is of a negative image type having a viscosity of 50 centipoises or less and the material for the second photoresist film is of a positive image type.

In a modification of the above example, the second photoresist film of the positive image type was formed by spin-coating on the first photoresist film of the negative image type without irradiation of the first photoresist film by ultraviolet ray, and was subjected to exposure and development process. In this case either, the etching of the first photoresist film by use of oxygen-plasma ashing successfully stopped at the contact layer, and the first photoresist film is left on the side surfaces of the ridge stripe for preventing exposure of the cladding layer of the semiconductor laser structure.

Since the above embodiments are described only for examples, the present invention is not limited to the above embodiments and various modifications or alterations can be easily made therefrom by those skilled in the art without departing from the scope of the present invention. For example, in the above embodiment, a ridge stripe having a double channel structure is exemplified. However, the present invention can be applied to an ordinary ridge stripe. In addition, the present invention can be applied to other semiconductor optical devices such as ridge waveguide semiconductor photodetector.

What is claimed is:

1. A method for fabricating a semiconductor optical device comprising the steps of:

forming a semiconductor layer structure including semiconductor active layer on a semiconductor substrate;

forming a ridge stripe on the semiconductor layer structure;

forming an insulator film on the semiconductor layer structure including the ridge stripe;

forming on the insulator film a first photoresist film of a negative image type having a viscosity of 50 centipoises or less;

forming a second photoresist film on the first resist film;

patterning the first and the second photoresist films to have therein an opening for exposing a portion of the insulator film at a top of the ridge stripe;

removing the portion of the insulator film exposed by the opening; and forming an optical device having the semiconductor active layer, the patterning step including development using a liquid developer to which the first and the second resist films have different solubility coefficients.

2. The method as defined in claim 1, wherein the patterning step includes the steps of patterning the second photoresist film by using an exposure and development process to form a mask, and patterning the first photoresist film by using a dry etching and the mask.

3. The method as defined in claim 2, wherein the dry etching includes oxygen-plasma ashing.

4. The method as defined in claim 1, wherein the second photoresist film is of a positive image type.

5. The method as defined in claim 1, wherein the semiconductor layer structure includes a contact layer and an upper cladding layer overlying the active layer, and the first photoresist film has a thickness smaller than a thickness of the contact layer.

6. The method as defined in claim 1, wherein the semiconductor optical device is a semiconductor laser device or a semiconductor photodetector.

7. The method of claim 1, further comprising the steps of:

exposing the first photoresist film to a first ultraviolet ray; and exposing the second photoresist film to a second ultraviolet ray, wherein the first photoresist film is made insoluable to the liquid developer by exposure to the first ultraviolet ray, and the second photoresist film is made soluable to the liquid developer by exposure to the second ultraviolet ray.

* * * * *

UNITED STATES PATENT AND TRADEMARK OFFICE
CERTIFICATE OF CORRECTION

| | |
|---|---|
| PATENT NO. | : 6,335,216 B1 |
| APPLICATION NO. | : 09/560570 |
| DATED | : January 1, 2002 |
| INVENTOR(S) | : Yoshida et al. |

It is certified that error appears in the above-identified patent and that said Letters Patent is hereby corrected as shown below:

On the title page, Item (30), the Foreign Application Priority Data should be deleted.

Signed and Sealed this

Twenty-fifth Day of March, 2008

JON W. DUDAS
*Director of the United States Patent and Trademark Office*